United States Patent [19]
Leshem et al.

[11] Patent Number: 5,602,717
[45] Date of Patent: Feb. 11, 1997

[54] HOT-PLUGGABLE DATA STORAGE DEVICE HAVING VIBRATION ABSORBING AND MECHANICAL CONNECTOR ALIGNMENT

[75] Inventors: Eli Leshem, Brookline; Tuvia Leneman, Newton; Lee Spechts, Billerica; Ernest Sachs, Framingham, all of Mass.

[73] Assignee: EMC Corporation, Hopkinton, Mass.

[21] Appl. No.: 281,308

[22] Filed: Jul. 27, 1994

[51] Int. Cl.$^6$ .................................. G06F 1/16; H05K 7/10
[52] U.S. Cl. ............................................ 361/685; 439/378
[58] Field of Search ..................................... 361/684, 685, 361/686, 679; 364/708.1; 439/378, 374, 380, 381

[56] References Cited

U.S. PATENT DOCUMENTS

| | | | |
|---|---|---|---|
| 4,633,350 | 12/1986 | Hanson | 360/98 |
| 4,998,892 | 3/1991 | Shiley | 439/378 |
| 5,045,960 | 9/1991 | Eding | 360/97.01 |
| 5,077,722 | 12/1991 | Geist et al. | 369/75.1 |
| 5,212,681 | 5/1993 | Bock et al. | 369/244 |
| 5,222,907 | 6/1993 | Katabuchi et al. | 439/378 |
| 5,269,698 | 12/1993 | Singer | 439/157 |
| 5,325,263 | 6/1994 | Singer et al. | 361/683 |

*Primary Examiner*—Leo P. Picard
*Assistant Examiner*—Lynn D. Feild
*Attorney, Agent, or Firm*—John M. Gunther, Esq.; Mark J. Casey, Esq.

[57] ABSTRACT

First and second pairs of pins and cooperative first and second pairs of pin receiving apertures are provided at the confronting connector faces of each of one or more data storage device carrier subassemblies and an interconnection board of a storage system card cage subassembly into which each data storage device carrier subassembly is slidably mounted. The first pin/aperture pair engage and cooperate first to prealign, mechanically support and vibrationally damp each data storage device carrier subassembly. The second/pin aperture pair engage and cooperate to secondly finely align a connector on each data storage device carrier subassembly with a mating connector on the storage system card cage subassembly, enabling hot-pluggable insertion and removal of each data storage device carrier subassembly into and out of the storage system card cage subassembly without physically damaging the confronting connectors of each data storage device carrier subassembly and storage system card cage subassembly interconnection board or causing electrical shorts in the connectors.

22 Claims, 4 Drawing Sheets

HOT-PLUGGABLE DATA STORAGE DEVICE HAVING VIBRATION ABSORBING AND MECHANICAL CONNECTOR ALIGNMENT

FIELD OF THE INVENTION

This invention is directed to the field of data storage devices, and more particularly, to a novel hot-pluggable, data storage device such as a disk drive having vibration absorbing and connector aligning mechanical interlock.

BACKGROUND OF THE INVENTION

Data storage systems employing so-called DASD's (direct access storage devices) are typically comprised of a plurality of data storage devices such as hard disk drive assemblies that are individually mounted in a common cabinet and that are electrically interconnected to provide a high-capacity data storage system. Typically, high-speed semiconductor cache memory is implemented along with the disk drive storage device assemblies to provide a selectively-configurable, high performance, data storage system commercially available from the assignee of the instant invention that may offer, for example, 6.8 GB or more of disk storage capacity, using 16, 32, 64 or even 128 disk drives.

Each hard disk drive assembly is typically enclosed by an elongated carrier to which a hard disk storage device is fastened. An electrical connector mounted at one end of the carrier is electrically interconnected to the hard disk storage device. A handle is provided at the other end of the carrier. An interconnection board having spaced-apart electrical connectors, one for each of the connectors of the hard disk assemblies, is mounted inside a common card cage of the data storage system. The hard disk drive assemblies are held by their handle ends and inserted and removed from the common card cage, respectively, to plug and unplug their connector ends from corresponding connectors provided therefor on the interconnection board mounted inside the card cage. Insertion and removal of each hard disk drive assembly is typically done with the power "off", as during initial set up and/or maintenance.

Slidably inserting each hard disk drive assembly, however, gives rise to various lateral forces that act to mis-align the mating connectors on each hard disk drive assembly and card cage interconnection board, potentially damaging the pins and connectors on the hard disk drive assembly and interconnection board. Additionally, partial or complete hard disk drive and/or storage system component failure may occur if, when a hard disk drive assembly is hot plugged, electrical connectors and pins make contact with unintended pins or connectors in the card cage. It is therefore critical to provide a direct access storage device which can be inserted and removed with the power "on", and whose connectors are always aligned and whose components as well as pins and connectors are preserved against damage caused by mis-alignment and unwanted power.

SUMMARY OF THE INVENTION

It is accordingly the principal object of the present invention to provide a hot-pluggable data storage device having a vibration absorbing and connector aligning mechanical interlock. The present invention features a data storage device carrier subassembly for a device such as a disk drive, and a vibration absorbing and connector aligning disk cage/ disk carrier mechanical interlock subassembly which can be slidably inserted into a disk cage subassembly. The disclosed disk cage subassembly includes a housing for supporting a plurality of disk drive assemblies, and an internal interconnection board having a plurality of spaced-apart connectors, where the number of the connectors equals the number of the disk drive devices to be supported in the card cage. The internal interconnection board may be a midplane interconnector or a backplane interconnector. One or more rigid frame members may be provided along the internal interconnection board to provide mechanical strength.

The disclosed disk carrier subassembly includes a frame member having a first portion, to which a disk drive is fastened, and a second portion, to which an interface board is fastened. The interface board is preferably a printed circuit board and includes a disk connector member. The disk drive is electrically interconnected to the disk connector via the interface board. The interface board provides the control and other signals that enable each disk drive mounted to a disk carrier subassembly to be hot-pluggable without powering off the storage system. A handle is provided on the frame of each disk carrier subassembly to enable the corresponding disk carrier subassembly to be manually inserted and removed into and out of the disk cage subassembly.

The disclosed disk card cage/disk carrier mechanical interlock subassembly includes first and second pairs of cooperative pins and pin-receiving holes that are provided on confronting faces of each of the several disk carrier subassemblies and interconnection board. The first pair of cooperative pins and pin receiving holes serves to ensure the pre-alignment (course alignment) of the individual connectors of the disk carrier subassemblies with the corresponding connectors provided on the interconnection board of the card cage subassembly, to support the weight of the disk drive devices about the corresponding connectors on the interconnection board, and which also serve to terminate any mechanical vibrations transferred from the disk drive to the rigid frame member of the interconnection board.

The second pair of cooperative pins and pin receiving holes serves to finely-align the disk carrier subassembly and interconnection board connectors ensuring that the pins of their respective connectors always mate reliably without pin damage.

In the preferred embodiment, the frame member of each disk carrier subassembly is provided with apertured flanges whose apertures mate with alignment pins mounted to the rigid frame of the interconnection board and cooperate with the pins to support the weight of the corresponding platters, absorb their vibration and pre-align the corresponding disk carrier subassembly connector and interconnection board connector. Each connector on the interconnection board is provided with pins that mate with apertures provided on each connector of the interface printed circuit board of the respective disk carrier subassemblies to provide the fine-alignment of the electrical conducting pins. Other vibration absorbing and connector aligning mechanical interlocking subassemblies may be provided at the several interfaces of the disk carrier subassemblies and their corresponding confronting portions of the interconnection board without departing from the inventive concept.

DESCRIPTION OF THE DRAWINGS

Other objects, features and advantages of the present invention will become apparent to those skilled in the art by reference to the following detailed description of the preferred embodiment and to the drawings, wherein.

DETAILED DESCRIPTION OF THE PREFERRED EMBODIMENT

Figure 1:
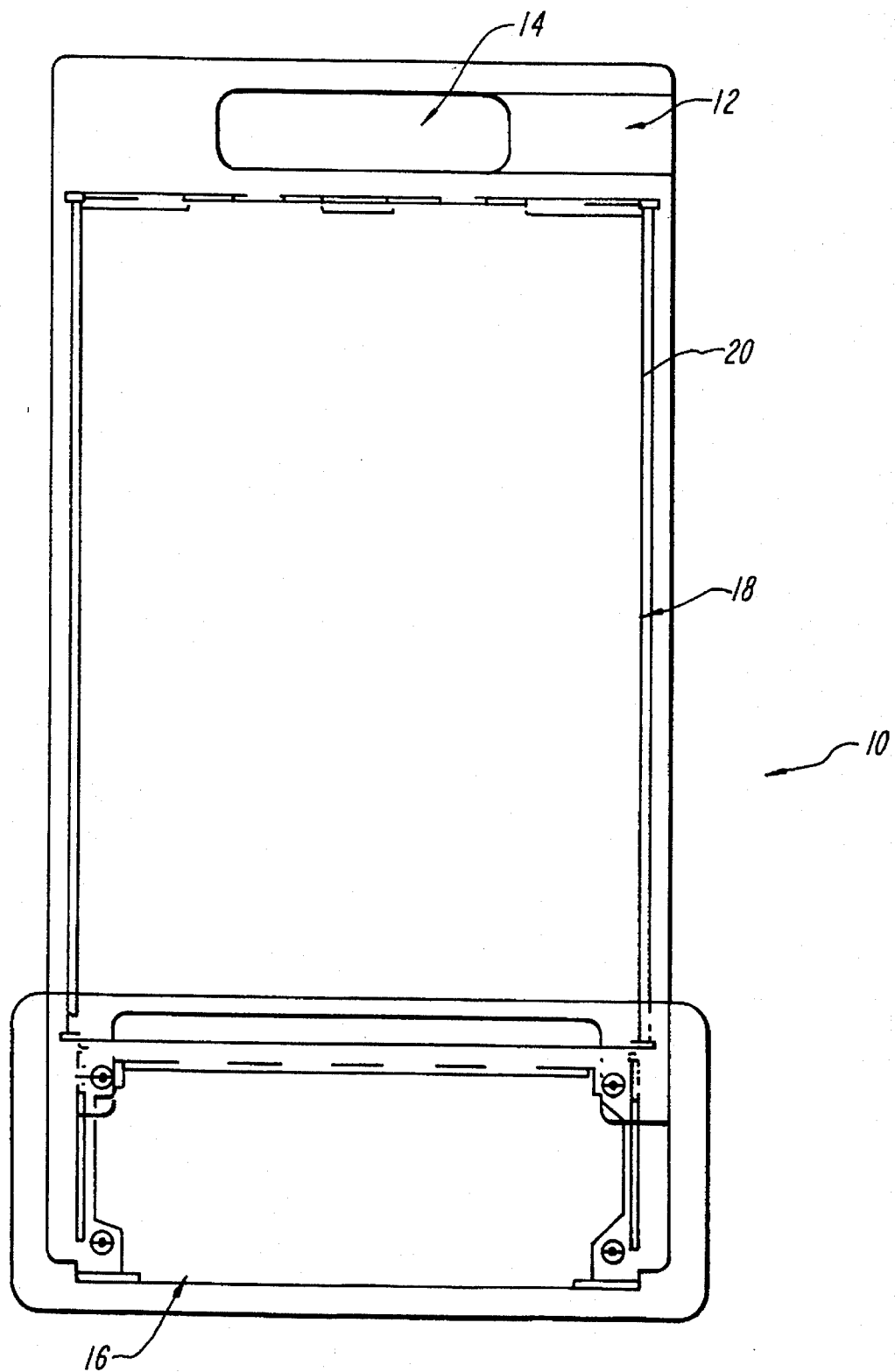
FIG. 1 is a top plan view of a frame member of the disk carrier subassembly of the present invention.

Referring now to FIG. 1, generally designated at 10 is a top plan of one embodiment of the frame of the disk carrier subassembly of the hot-pluggable DASD having vibration absorbing and connector aligning mechanical interlock in accord with the present invention. The frame 10 is fashioned of any suitable material, such as aluminum, and includes a handle portion 12. The handle 12, provided on the outer end of the frame 10, has walls defining a hand-manipulable opening 14. By grasping the opening 14 of the handle 12, the user is able to insert and remove individual disk carrier subassemblies into and out of the disk card cage subassembly to be described.

At the interior end of the frame 10 an interface board receiving frame portion 16 is provided. The interface board receiving frame portion 16 receives an interface board to be described which is mounted thereto in any suitable manner, such as by threaded fasteners. The interface board includes a connector to be described.

Intermediate the handle 12 and the interface board receiving end 16 of the frame 10 is a disk drive receiving portion 18. The disk drive receiving portion 18 includes walls 20 that define an enclosure into which a disk drive is inserted and to which it is secured by any suitable means, such as by threaded fasteners. The disk drive is electrically interconnected to the connector of the interface board.

Figure 2:
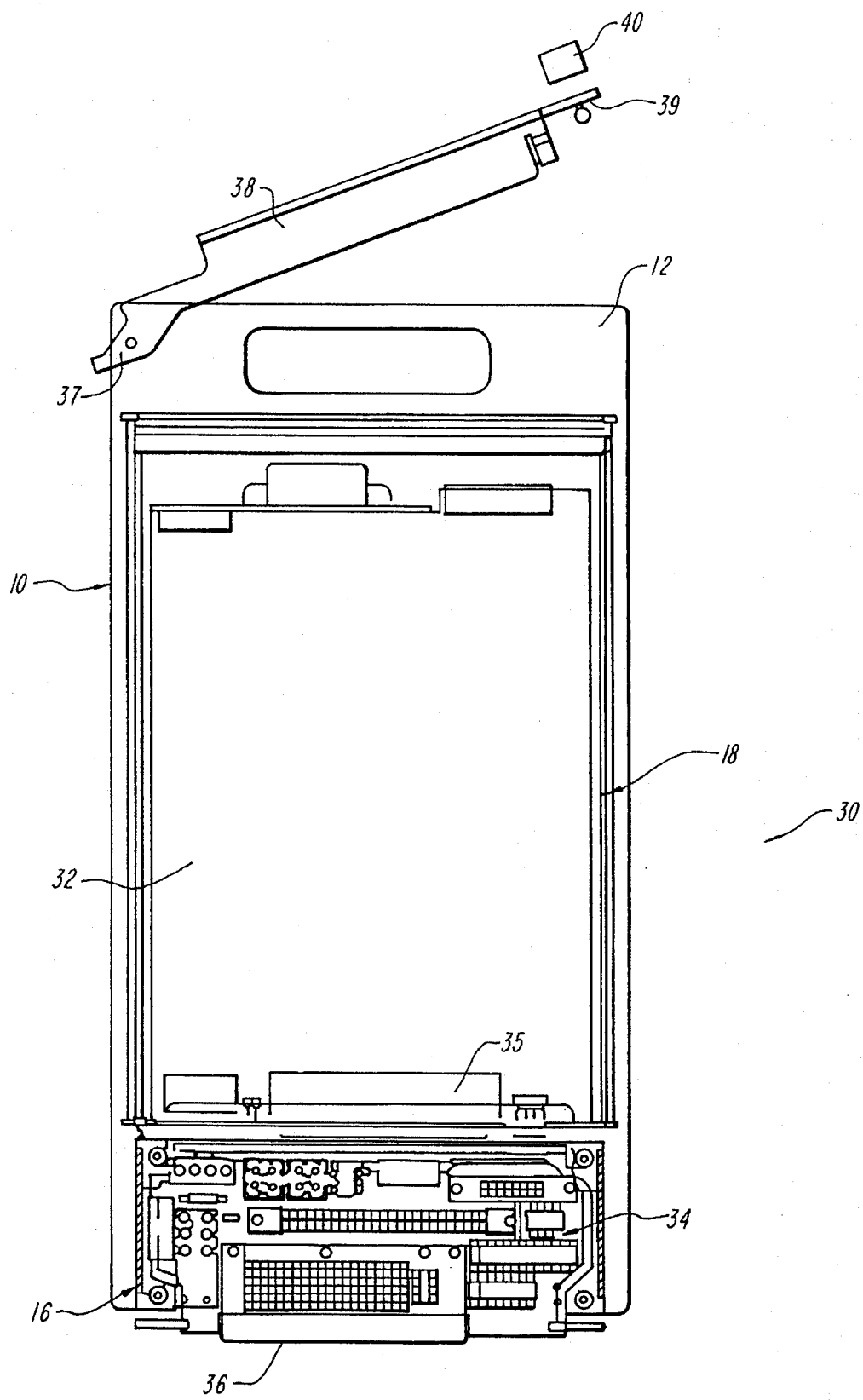
FIG. 2 is a top plan view of the disk carrier subassembly of the present invention.

Referring now to FIG. 2, generally designated at 30 is a top plan view of the disk carrier subassembly including a hot-pluggable data storage device having vibration absorbing and connector aligning mechanical interlock of the present invention. A disk drive, optical drive, tape drive, or other type of similar data storage device 32 is mounted into the frame portion 18 and an interface board generally designated 34 is mounted in the interface board receiving frame portion 16 of the frame 10. The storage device 32 is electrically interconnected via a first connector 35 and an interface board 34 to a second connector 36 at the inside end of the frame 10. The interface board interface card 34 provides control and other signals that enable each disk carrier subassembly to be hot-pluggable.

An ejector and lock member 38 is pivotally mounted to handle end 12 of frame 10 of the disk carrier subassembly 30. The ejector and lock member 38 includes at a first end 39 opposite its pivotally mounted end 37 a closure device such as a hand-manipulable threaded nut 40. The nut 40 threads to the disk cage subassembly, which releasably secures the sub-assembly 30 in the disk cage subassembly.

Figure 3:
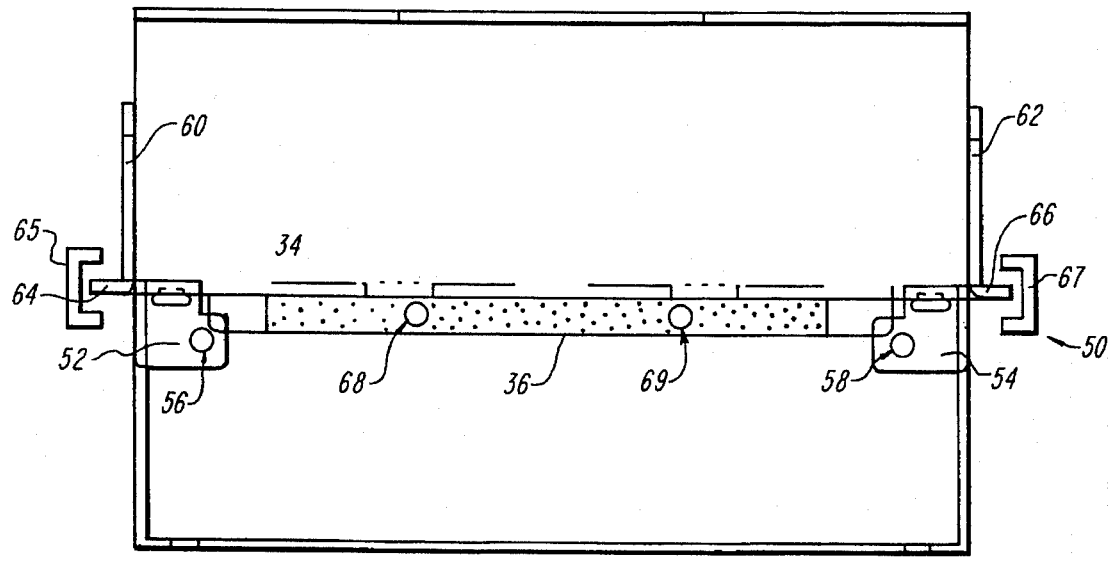
FIG. 3 is an end view of the inside end of the frame member of the disk carrier subassembly of the present invention and illustrates a portion of the disk cage subassembly and a portion of the connector of the interface board of the disk carrier subassembly.

Referring now to FIG. 3, generally designated at 50 is an end view of the inside end of the frame member 10 of the disk carrier subassembly of the present invention which illustrates a portion of the disk cage subassembly and a portion of the connector of the interface board of the disk carrier subassembly. First and second flanges 52, 54 that project inwardly toward each other are provided on the inside of the disk drive supporting walls 20. The flanges 52, 54 are provided with apertures 56, 58. The planes of the flanges 52, 54 are oriented such that imaginary lines drawn perpendicular thereto are parallel to the direction of insertion and removal of the frames 10 of the several disk carrier subassemblies into and out of the disk card cage subassembly.

A first set of pins in the card cage (to be described below) extend parallel to the direction of insertion and removal of the data storage device carrier subassembly are received into the apertures 56, 58. This first set of pins serves to pre-align the connector 36 coupled to the interface board with its corresponding connector on the disk cage subassembly interconnection board (to be described below). The first set of pins also serves to support the mass of the hard disk drives at the inside ends of the disk carrier subassemblies and serve to absorb any system vibration thereby preventing damage to the connectors, and their pins, as will be described more fully below.

Plates 60, 62 having outwardly extending flanges 64, 66 are fastened to the walls 20 of the frame 10. The flanges 64, 66 provide rails that cooperate with mating grooves or tracks 65, 67 provided on the disk card cage subassembly, to provide a linear bearing region along which each disk carrier subassembly is slidably inserted and removed into and out of the disk card cage subassembly. Typically, the storage devices are inserted vertically in the card cage, although horizontal orientation is contemplated. Rails 64, 66 and complimentary grooves or tracks 65, 67 are low-tolerance mechanical devices which are manufacturable at a comparatively-low-cost. Such a low-cost linear bearing arrangement is enabled by the pre-alignment action of the first pins that are received into the apertures 56, 58. Any other suitable implementation of the linear bearing may, of course, be employed without departing from the present invention.

Connector 36 is also provided with apertures 68, 69. The apertures 68, 69 receive a second pair of pins (to be described below) that serve to finely align the connector 36 and the mating connector (to be described below) provided on the interconnection board of the disk cage subassembly.

Figure 4:
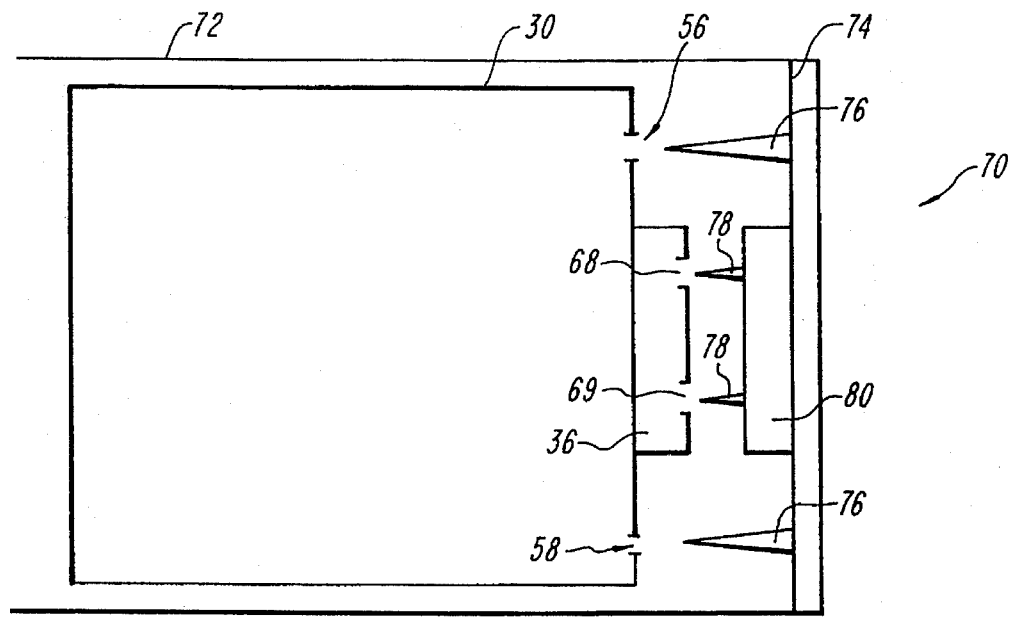
FIG. 4 is a schematic view of a portion of the mating and interlocking disk carrier and disk cage subassemblies of the present invention in their un-mated condition.

Referring now to FIG. 4, generally designated at 70 is a top or side schematic view of a portion of the mating and interlocking disk carrier and disk cage subassemblies of the present invention in their un-mated condition. Disk carrier subassembly 30 is shown received within disk-cage subassembly 72. The disk cage subassembly 72 includes an interconnection board also commonly referred to as a backplane or midplane.

A first pair of pins 76 extend from and beyond the interconnection board 74 and are aligned with first apertures 56, 58 provided on the disk carrier frame by means, such as for example, by the flanges 52, 54 (FIG. 3). A second pair of pins 78 extend from and beyond connector 80 mounted to the interconnection board 74 and are aligned with the second apertures 68, 69 of connector 36. The first pair of pins 76 and mating apertures 56, 58 engage first and serve to roughly pre-align the disk carrier subassembly 30 and thus the connector 36 with interconnect board 74 and ultimately the mating connector 80 of the disk cage subassembly.

In addition, the first pair of pins 76, 78 may, in one embodiment, have a conical or tapered shape wherein the base of the pins have a larger diameter than the tip. This shape serves to more finely align the disk carrier assembly the more apertures 56, 58 engage with pins 76. The second pair of pins 78 are shorter in length than the first pair of pins 76 and thereby engage secondly or later with mating apertures 68, 69 and serve to finely align the connectors 36, 80.

Although the first and second pins are described as pairs, this is not a limitation of the present invention as one or more pins may be provided for each set or pair of pins without departing from the present invention. Further, the pins may be located on either the data storage device carrier or the mating interconnection board. The present described embodiment being preferred and used for exemplary purposes only.

Figure 5:
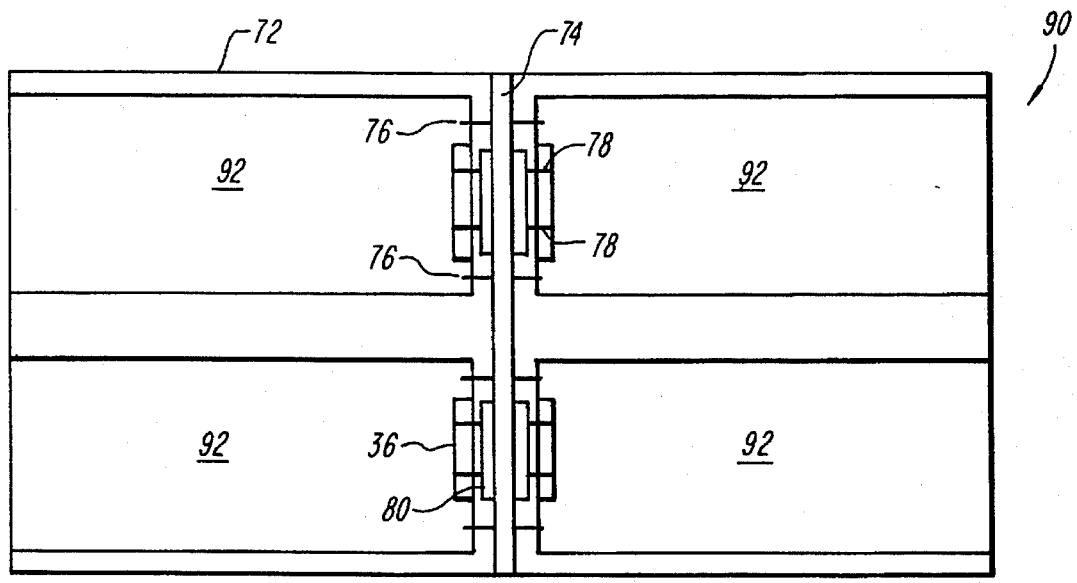
FIG. 5 is a schematic side view of the mating and interlocking disk carrier and disk cage subassemblies of the present invention in their mated condition.

Referring now to FIG. 5, generally designated at 90 is a schematic side or top view of the mating and interlocking disk carrier and disk cage subassemblies of the present invention in their mated condition. For exemplary purposes, four (4) disk carrier subassemblies generally designated 92 are shown inside of disk cage subassembly 72. A midplane interconnection board 74 having a rigid frame member is mounted at the midplane of the cage 72. Although a midplane interconnection board 74 and a double sided configuration of disk carrier subassemblies 92 are illustrated, it will be appreciated by those skilled in the art that in different embodiments of the present invention, the interconnection board may be located at the cage backplane and that the disk carrier subassemblies can be differently configured in a different cage without departing from the present invention.

For each disk carrier subassembly 92, the first pair of pins 76, are rigidly mounted to a solid structural member proximate or surrounding the interconnection board 74 or the interconnection board itself. The direction of elongation of each pair of first pins 76 is parallel to the disk subassemblies direction of insertion and removal and each pair of first pins 76 is aligned with corresponding apertures 56, 58 of the corresponding disk carrier subassembly 72. In their inserted condition, the apertures 56, 58 of the corresponding disk carrier subassembly 72 receive the corresponding first pair of pins 76 therein.

The disk carrier frame engaged with first pair of pins 76 transmits any vibrations produced by the rotation of the corresponding hard disk drive platter or the system in general through the corresponding pins 76 to the structural member of the interconnection board 74 where the vibration is absorbed, thereby preventing the unwanted vibrations from affecting the operation of the data storage device housed in the carrier subassembly.

The reception of the first pair of pins 76 into their corresponding apertures 56, 58 on the carrier subassembly thus also serves to prealign the connector 36 of the disk carrier subassembly 30 with the corresponding interconnection board connector 80 in the cage and supports the weight of the inside end of the disk carrier subassembly. The pins 76 cooperate with the apertures 56, 58 of the flanges 52, 54 (FIG. 3) to prealign each disk carrier subassembly within its respective data storage device cage subassembly and to absorb vibrational energy, whereby the pins of the mating connectors 36, 80 are mechanically pre-aligned and generally insulated from vibration induced misalignment or intermittent misalignment.

The second pair of pins 78 located on the connector 80 itself, in this example, between the first pair of pins 76, is provided on the interconnection board 74 of the cage 72 for every disk carrier subassembly 30. The second pair of pins 78 are received in mating apertures 68, 69 provided on the connector 36 of the interface board of each disk carrier subassembly. The second pair of pins 78 mate with the pin receiving apertures 68, 69 after the first pair of pins 76 mate or engage with apertures 56, 58 and thereby provide fine-alignment of the connector pins associated with each pair of mating connectors 36, 80 thereby ensuring a trouble-free, long-term connection as well as hot-plugability.

Accordingly, the present invention provides a novel, self-managing, mechanical connection alignment system for an electronic assembly. A first pin and aperture combination engage first and serve to roughly align two mating electrical connectors. A second pin and aperture combination engages after the first pin/aperture combination and serves to finely align the two mating electrical connectors. The pins and apertures may be located on either one of first or second devices to be electrically connected to provide the mechanical alignment and support.

Modifications and substitutions by one of ordinary skill in the art are considered to be within the scope of the present invention which is not to be limited except by the claims which follow.

What is claimed is:

1. A hot pluggable data storage device carrier having a vibration absorbing and connector aligning mechanical interlock, comprising:

at least one removable data storage carrier subassembly, each said data storage carrier subassembly including a frame member having an inside end and an outside end, a data storage device fastened to the frame member intermediate to said frame member's inside and outside ends, a data storage device connector supported by said frame member and located at the inside end thereof, and an interconnection member for electrically interconnecting said data storage device connector to said data storage device;

a data storage system card cage subassembly for receiving said at least one data storage carrier subassembly, including an interconnection board member mounted within said data storage system card cage subassembly, said interconnection board member including at least one dedicated connector for said at least one data storage carrier subassembly;

a data storage mechanical interlock subassembly for each of said at least one data storage device carrier subassembly, said mechanical interlock assembly including at least one first rigid member that extends from said interconnection board member and is aligned with said inside end of said frame member and pre-aligns the data storage device connector and the dedicated connector when each said at least one data storage device carrier subassembly is inserted into said data storage system card cage subassembly, and further including at least one second rigid member that extends from said dedicated connector and is aligned with said data storage device connector and finely-aligns the data storage device connector and the dedicated connector provided therefor on the interconnection board member when said at least one data storage device carrier is inserted into said data storage system assembly.

2. The data storage device carrier of claim 1, wherein said interconnection board member is a midplane interconnection board.

3. The data storage carder of claim 1, wherein said interconnection board member is a backplane interconnection board.

4. The data storage device carrier of claim 1, wherein said data storage device carrier includes a data storage carrier subassembly mounting system, and said data storage subassembly mounting system includes a rail and groove mounting system.

5. The data storage device carrier of claim 4, wherein said rail is provided by an outwardly directed flange carried by the frame member of each of said at least one disk carrier subassembly and said groove is provided by walls defining a slot that receive the rail provided on said disk cage subassembly.

6. The data storage device carrier of claim 1, wherein said data storage device is a disk drive.

7. The data storage device carrier of claim 1, wherein said interconnection board member is an interface printed circuit board.

8. The data storage device carrier of claim 1, further including a handle provided at the outside end of the frame member of each said at least one data storage device carrier sub assembly.

9. The data storage device carrier of claim 8, further including means for removably securing each said data storage device carrier subassembly into said data storage system card cage assembly.

10. The data storage device carrier of claim 9, wherein said removably securing means includes an ejector handle pivotably mounted to the outside end of each said frame member of said at least one data storage device carder subassembly.

11. The data storage device carrier of claim 1, wherein said at least one rigid first member includes at least one first pin that extends into a cooperative aperture provided for the at least one first pin.

12. The data storage device carrier of claim 11, wherein the at least one first pin is fastened to the interconnection board and wherein walls defining said cooperative aperture are provided on the inside end of said frame member.

13. The data storage device carrier of claim 11, wherein said at least one first rigid member includes a pair of rigid first pins that are fastened in spaced apart relation to the interconnection board member, and wherein flanges having walls defining first and second apertures are provided on the inside end of the frame member of said data storage device carrier subassembly, such that, the pair of said first pins when mated with the first and second apertures serve to, pre-align the data storage device, and the dedicated connector.

14. The data storage device carrier of claim 1, wherein said at least one second rigid member included at least one second pin that extends into a cooperative aperture provided for the at least one second pin, wherein said at least one second pin extends into said cooperative aperture after said at least one first rigid member pre-aligns the data storage device connector and said at least one dedicated connector.

15. The data storage device carrier of claim 14, wherein the at least one second pin is fastened to the interconnection board member and wherein walls defining said cooperative aperture are provided on said data storage device connector.

16. The data storage device carrier of claim 14, wherein said second member includes a pair of rigid second pins that are fastened to the at least one dedicated connector of the interconnection board member and wherein walls defining at least two second pin receiving apertures are provided on the data storage device connector of each said data storage device carrier subassembly and serve to finely align the data storage device and at least one dedicated connector.

17. The data storage carrier of claim 1, wherein said second rigid member finely-aligns said data storage connector and said at least one dedicated connector prior to electrical contact between said data storage device connector and said at least one dedicated connector.

18. A mechanical connector alignment system, comprising:
a first removable device to be electrically connected to a second device, said first removable device including at least one electrical connector, said second device including at least one electrical connector disposed in mating relationship with at least one electrical connector on said first removable device;
one of said first and said second devices including at least one first alignment pin and the other one of said first and second devices including at least one first alignment pin aperture, said first alignment pin engaging with said first alignment pin aperture when said first removable device is electrically connected to said second device;
one of said first and said second devices including at least one second alignment pin, and the other one of said first and second devices including at least one second alignment pin aperture, said second alignment pin engaging with said second alignment pin aperture when said first removable device is electrically connected to said second device; and;
said first alignment pin engaging with said first alignment pin aperture prior to said second alignment pin engaging with said second alignment pin aperture and said second alignment pin engaging with said second alignment pin aperture prior to said at least one electrical connector on said first removable device engaging with said at least one electrical connector on said second device.

19. The system of claim 18 wherein said first alignment pin is of a first predetermined size, and said second alignment pin is of a second predetermined size; and
wherein said first predetermined size of said first alignment pin relative to said predetermined size of said alignment pin is such that said first alignment pin engages with said first alignment pin aperture prior to said second alignment pin engaging with said second alignment pin aperture when said first removable device is electrically connected to said second device.

20. The system of claim 19 wherein said at least one first alignment pin and said at least one second alignment pin are disposed proximate said at least one electrical connector of said second device; and
wherein said first alignment pin protrudes beyond a front surface of said at least one electrical connector disposed on said second device further than said at least one second alignment pin protrudes beyond said front surface of said at least one electrical connector.

21. The system of claim 20 wherein said at least one first alignment pin is longer than said at least one second alignment pin.

22. The data storage carrier of claim 17, wherein at least one said first rigid member pre-aligns said data storage device connector and said dedicated connector to said at least one second rigid member finely-aligning said data storage device connector and said dedicated connector.

* * * * *